United States Patent [19]

Kwasnick et al.

[11] Patent Number: 5,273,920
[45] Date of Patent: Dec. 28, 1993

[54] METHOD OF FABRICATING A THIN FILM TRANSISTOR USING HYDROGEN PLASMA TREATMENT OF THE GATE DIELECTRIC/SEMICONDUCTOR LAYER INTERFACE

[75] Inventors: Robert F. Kwasnick; George E. Possin, both of Schenectady, N.Y.

[73] Assignee: General Electric Company, Schenectady, N.Y.

[21] Appl. No.: 939,746

[22] Filed: Sep. 2, 1992

[51] Int. Cl.$^5$ .......................................... H01L 21/265
[52] U.S. Cl. ............................................ 437/40; 437/2; 437/5; 437/909; 437/101; 148/DIG. 1
[58] Field of Search ................... 437/40, 2, 4, 5, 101, 437/909; 148/DIG. 1

[56] References Cited

U.S. PATENT DOCUMENTS 4,741,964  5/1988  Haller ................................. 437/40

OTHER PUBLICATIONS

Ihara et al., Improvement of Hydrogenated Amorphous Silicon n-i-p Diode Performance by $H_2$ Plasma Treatment for i/p Interface, Dec. 1990, Japanese Journal of Applied Physics, vol. 29, No. 12, pp. L2159-L2162.
Yamaguchi et al., The Effect of Hydrogen Plasma on the Properties of a-Si:H/a-Si$_{1-x}$ N$_x$:H Superlattices, 1988, Philosophical Magazine Letters, vol. 58, No. 4, 213-218.
Fenner et al., Silicon Surface Passivation by Hydrogen Termination: A Comparative Study of Preparation Methods, Jul. 1 1989, J. Appl. Phys. 66(1).
Wu et al., Passivation kinetics of Two Types of Defects in Polysilicon TFT by Plasma Hydrogenation, Apr. 1991, IEEE Electron Device Letters, vol. 12, No. 4.
Chen, Elimination of Light-Induced Effect in Hydrogenated Amorphous Silicon, Oct. 3, 1988, Appl. Phys. Lett 53(14).
Veprek et al., Surface Hydrogen Content and Passivation of Silicon Deposited by Plasma Induced Chemical Vapor Deposition from Silane and The Implications for the Reaction Mechanism, Jul./Aug. 1989, J. Vac. Sci. Technol. A7(4).
Jackson et al., Effect of Hydrogen on Disorder in Amorphous Silicon, 1991, Philosophical Magazine B, vol. 64, No. 5, 611-622.

Primary Examiner—Brian E. Hearn
Assistant Examiner—Tuan Nguyen
Attorney, Agent, or Firm—Donald S. Ingraham; Marvin Snyder

[57] ABSTRACT

A method of fabricating a thin film transistor (TFT) includes the steps of forming a gate conductor on a substrate; depositing a gate dielectric layer of silicon nitride over the gate conductor; treating the exposed silicon nitride on the surface of the gate dielectric layer with a hydrogen plasma at a power level of at least 44 mW/cm$^2$ for at least 5 minutes; depositing a layer of amorphous silicon semiconductor material over the gate dielectric layer; depositing a layer of n+ doped silicon over the treated amorphous silicon surface; depositing a layer of source/drain metallization over the n+ doped layer; and patterning the source/drain metallization and portions of the underlying n+ doped layer to form source and drain electrodes. The deposition of the TFT material layers and the hydrogen plasma treatment is preferably by plasma enhanced chemical vapor deposition.

6 Claims, 1 Drawing Sheet

METHOD OF FABRICATING A THIN FILM TRANSISTOR USING HYDROGEN PLASMA TREATMENT OF THE GATE DIELECTRIC/SEMICONDUCTOR LAYER INTERFACE

RELATED APPLICATIONS AND PATENTS

This application is related to copending application Ser. No. 07/939,749, filed concurrently with this application, entitled "Method of Fabricating a Thin Film Transistor Using Hydrogen Plasma Treatment of the Intrinsic Silicon/Doped Layer Interface", which application is assigned to the same assignee of the present invention and incorporated herein by reference.

BACKGROUND OF THE INVENTION

This invention relates generally to the fabrication of semiconductor devices and in particular to the fabrication of field effect transistors such as amorphous silicon inverted thin film transistors (TFTs).

Thin film transistors fabricated from, among other materials, amorphous silicon, are commonly used to control arrays of solid state devices such as photodiodes, liquid crystal devices, or the like, which form the active parts of displays, facsimile devices, or imagers. Performance of such an array of active devices is typically enhanced by improving response (or switching) time of the TFTs, reducing switching transients and noise, reducing RC response time, and increasing the fill factor (i.e., increasing the portion of the total pixel area taken up by the active device in imager and display arrays).

TFT performance is affected by the mobility of the charge carriers in the semiconductor material of the TFT. High carrier mobilities are desirable as they allow a semiconductor device such as a thin film transistor (TFT) to have high operating speed and high transconductance. Such characteristics result in lower capacitance noise and switching transients, and higher switching speeds, all of which enable small size TFTs to be used in large area displays or imagers, thereby providing more space for the active components of those arrays (such as photodiodes, liquid crystal devices, or the like).

It is thus desirable to fabricate TFTs through a process that produces a transistor having desirable electrical characteristics, such as high carrier mobility. The fabrication process must also produce a device having mechanical characteristics, such as structural integrity and component arrangement, that enable it to exhibit the desired electrical characteristics when put to its intended use. For example, the device must not structurally deteriorate through loss of adhesion between the component layers of the device. Plasma-enhanced chemical vapor (PECVD) deposition is commonly used for depositing materials to form TFTs. The fabrication process necessarily involves deposition of layers of conductive, semiconductive, and insulative material over a substrate and patterning portions of these layers to form the desired TFT island structures. The layers of materials should adhere well to one another during and after being exposed to these processing steps. It is desirable that any treatment to enhance structural stability be compatible with PECVD techniques, which require the device to be exposed to elevated temperatures and electric fields, and reduced pressures during the deposition processes.

Treatment of portions of certain non-TFT semiconductor devices with a hydrogen plasma has been studied. For example, hydrogen plasma treatment applied after the deposition of each thin layer of a superlattice structure was discussed in an article by M. Yamaguchi, K Yatabe, H. Ohta, and K. Morigaki entitled "The effect of hydrogen plasma on the properties of a-Si:H/a-Si$_{1-x}$N$_x$:H superlattices" in *Philosophical Magazine Letters*, Vol. 58, pp 213–18 (1988). The superlattice structure was formed from alternating layers of amorphous silicon and either semiconductive silicon nitride or insulative silicon nitride. Each of the layers in the Yamaguchi superlattice are much thinner than corresponding layers of similar materials in a typical field effect transistor (FET); e.g., the amorphous silicon layer in the Yamaguchi device has a thickness in the range between 20 Å and 30 Å (as opposed to typical thicknesses of 200 Å to 1000 Å in a FET), and each of the silicon nitride layers has a thickness of about 40 Å (as opposed to thicknesses of 200 Å to 3000 Å in a TFT). Yamaguchi et al. measured photoluminescent spectra, a bulk material phenomenon (as opposed to a phenomenon associated only with the interface of two materials), both in superlattice structures formed with amorphous silicon and semiconducting silicon nitride (a-Si$_{0.6}$N$_{0.4}$:H) layers or with insulating silicon nitride (a-Si$_{0.43}$N$_{0.57}$:H) layers. The Yamaguchi et al. data indicate that the photoluminescent spectra for hydrogen plasma treated samples shifted slightly to peak at a higher photon energy and appeared to not evidence a secondary luminescence peak associated with defects in amorphous silicon. Luminescence intensity also appeared to increase slightly for samples treated with the hydrogen plasma.

It is thus an object of this invention to provide a method of fabricating a thin film transistor that consistently produces a TFT with relatively high mobility in the semiconductor layer which is readily integrated with other TFT fabrication steps.

It is a still further object of this invention to provide a method of fabricating a TFT that exhibits good adhesion between layers of the device.

SUMMARY OF THE INVENTION

In accordance with this invention, a thin film transistor is fabricated by forming a gate conductor on an upper surface of a substrate; depositing over the gate conductor a gate dielectric layer having at least an uppermost layer of silicon nitride; treating the exposed surface of the silicon nitride with a hydrogen plasma at a power level of at least 44 mW/cm$^2$ for at least 5 minutes; depositing a layer of substantially hydrogenated intrinsic amorphous silicon over the treated silicon nitride of the gate conductor; depositing a layer of n+ doped amorphous silicon over the amorphous silicon layer; depositing a layer of source/drain metallization over the n+ doped silicon layer; and patterning the source/drain metallization layer to form respective source and drain electrodes. The hydrogen plasma is applied to the exposed silicon nitride surface in a plasma enhanced chemical vapor deposition reactor vessel at a selected flow rate and a selected pressure, for a selected exposure time and at a selected power density. The hydrogen treatment is advantageously applied in sequence between the deposition of the gate dielectric layer and the amorphous silicon layer with vacuum being maintained in the reactor vessel during the transition between these steps; alternatively the hydrogen plasma treatment may be applied in fabrication processes in which vacuum is broken between the deposition of the gate dielectric layer and the intrinsic amorphous silicon layer, such as to pattern the underlying layers.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanying drawings in which like characters represent like parts throughout the drawings, and in which the single FIGURE illustrates a typical TFT fabricated in accordance with this invention.

DETAILED DESCRIPTION OF THE INVENTION

Figure 1:
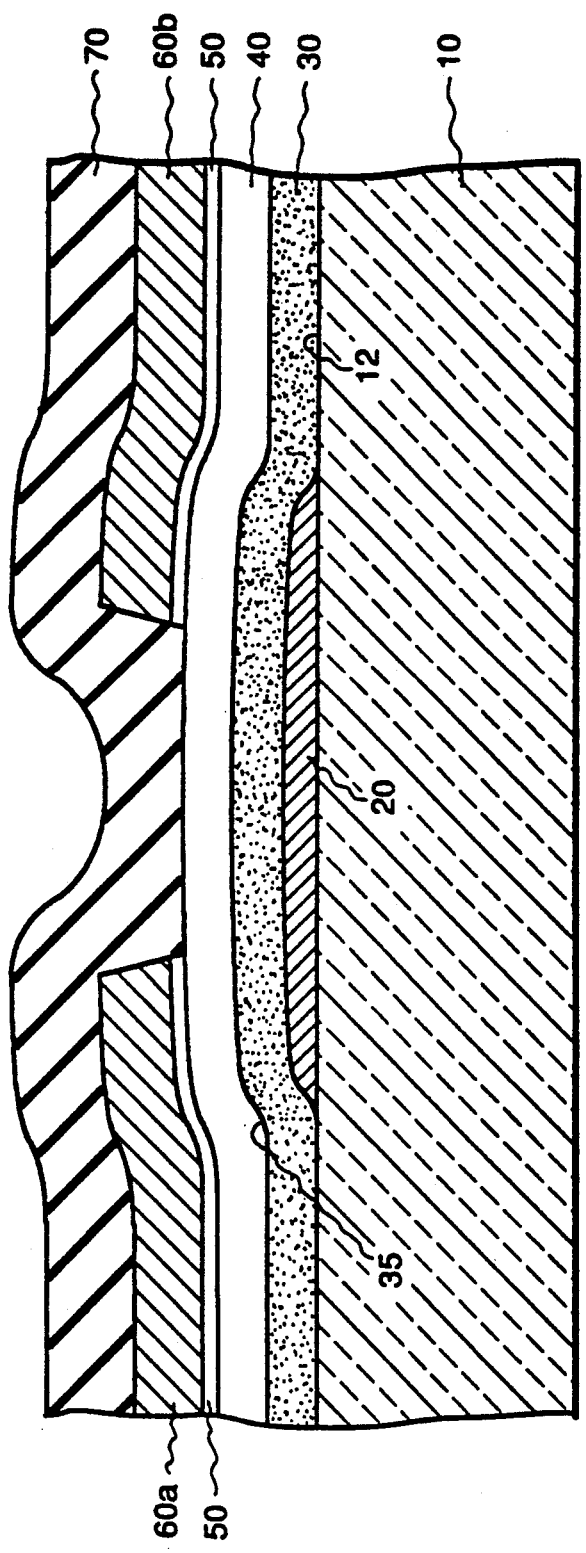

The method of this invention is advantageously used in the fabrication of inverted thin film transistors (TFTs) that have a silicon nitride gate dielectric/amorphous silicon semiconductor interface. The Figure illustrates a representative TFT fabricated in accordance with this invention.

The TFT is fabricated on a substrate 10 which typically comprises an insulative material such as glass or the like. A gate conductor 20 is formed on an upper surface 12 of substrate 10. Gate conductor 20 typically comprises a conductive layer of a metal such as aluminum (Al), chromium (Cr), titanium (Ti), or the like, or may alternatively comprise a multi-layer structure. After the desired metal layers are deposited on substrate 10, the metal is patterned to form the gate conductor. As used herein, "patterned" refers to shaping a deposited layer of material to have a desired form and dimensions using, for example, photolithography or other methods for selectively shaping a layer, such as planarization and selective etching techniques.

A gate dielectric layer 30 is deposited over gate conductor 20 and the exposed portions of substrate upper surface 12. This layer is deposited by conventional deposition techniques, preferably such as plasma enhanced chemical vapor deposition (PECVD). Gate dielectric layer 30 comprises at least silicon nitride, with the stoichiometric ratio of the nitrogen to silicon having a range of between about 1.2 to 1.45. Alternatively, gate dielectric layer 30 may comprise one or more layers of silicon nitride ($SiN_x$), silicon oxide ($SiO_y$), or the like, provided that silicon nitride comprises the uppermost portion of gate dielectric layer 30 (that is, furthest from substrate upper surface 12). Gate dielectric layer 30 is deposited to a thickness between about 200 Å and 3000 Å.

In accordance with this invention the exposed surface of the silicon nitride in gate dielectric layer 30 is treated with a hydrogen plasma which is applied at least at a power level of 440 mW/cm$^2$ for 5 minutes. As used herein, "treated" refers to the process by which the uncovered (or exposed) surface of the amorphous silicon layer is exposed in a reactor vessel to a hydrogen plasma at a selected flow rate and a selected pressure, for a selected exposure time and at a selected plasma power density. The hydrogen plasma treatment is preferably accomplished in the same reactor vessel used for PECVD of the gate dielectric layer 30 and amorphous silicon layer 40. The selected values of the pressure, temperature, and power density may vary within predetermined ranges, discussed below, during the treatment process. Representative values of the pressure, temperature, and power density for a reactor vessel having an electrode to substrate distance of about 2.8 cm ($\approx 1.1$ inches) and in which the electrode cross-sectional area is about 4560 cm$^2$ ($\approx 30$ inch diameter) and which operates at 13.56 MHz, the selected plasma flow rate is typically 300 standard cubic centimeters per minute (sccm), but may be in a range between about 30 and 2000; the selected pressure of the plasma is typically about 800 mTorr, and can range between about 400 mTorr and 1200 mTorr; the selected exposure time and selected plasma power density are usually about 30 minutes and 220 mW/cm$^2$, respectively, with the selected exposure time ranging between about 5 and 60 minutes, and the selected power density ranging between about 44 mW/cm$^2$ and 440 mW/cm$^2$. These parameters for applying the hydrogen treatment in the reactor vessel are selected to produce the desired modification of the silicon nitride exposed surface so as to enhance effective electron mobility at the interface of this surface and the overlying amorphous silicon semiconductor material.

The effect of the hydrogen plasma treatment is that the silicon nitride surface is exposed to hydrogen ions having energies between about 10 eV and 100 eV that passivate the surface, in part by driving off impurities and in part by smoothing the surface. The surface is thus physically and chemically prepared to be covered with the semiconductor material and thereby form a dielectric/semiconductive material interface 35 that promotes high effective electron mobility in the semiconductor material. Interface 35 typically comprises the surfaces of the two respective adjoining layers, with the increase in effective mobility being determined by the interrelation the two adjoining materials to a depth between about 50 Å to 100 Å from the outermost portion of the surface.

Amorphous silicon layer (or semiconductor layer) 40 is deposited over gate dielectric layer 30, for example by a conventional method such as PECVD. Amorphous silicon layer 40 comprises substantially hydrogenated intrinsic amorphous silicon (a-Si) and is deposited to a thickness of between about 200 Å and 3000 Å.

A layer of n+ doped amorphous silicon 50 is deposited over the amorphous silicon. As used herein, n+ doped silicon refers to silicon which has been doped to exhibit n+ type conductivity. Doped silicon layer 50 is typically deposited to a thickness of between about 100 Å and 1500 Å.

A layer of source/drain metallization 60 is then deposited over the n+ layer to a thickness in a range between about 0.05 micron and 2 microns. Source drain metallization layer is patterned to form a source electrode 60a and a drain electrode 60b. Source/drain metallization 60 typically comprises a metal such as tantalum, chromium, aluminum, molybdenum, or the like, or alternatively a multilayer structure of such metals. Patterning of source and drain electrodes 60a, 60b typically includes removing a portion of metallization layer 60 and the n+ doped layer disposed thereunder in the vicinity of gate conductor 20 such that the source and drain electrodes are disposed a selected overlap distance over the gate conductor, with only amorphous silicon semiconductor layer (and the layers disposed under the semiconductor layer) remaining between the respective source and drain electrodes. A passivation dielectric 70, such as silicon nitride or silicon oxide, is typically deposited to a thickness of between about 1000 Å and 10000 Å over the completed device.

For reasons set out in copending application Ser. No. 07/939,749, cited above, which is assigned to the assignee of the present invention and incorporated herein by reference, it is also advantageous for the fabrication of a TFT to apply a hydrogen plasma treatment to the exposed top portion of amorphous silicon layer 40 prior to the deposition of the n+ doped silicon layer, which reduces contact resistance between the amorphous silicon and the doped silicon contact layer.

This invention is advantageously used in fabricating processes in which vacuum is maintained in the PECVD-reactor vessel between the deposition of gate dielectric layer 30 and depositing amorphous silicon layer 40. Alternatively, the method of this invention is also advantageously used in TFT fabrication processes in which vacuum is broken between these deposition steps, for example, to process the wafer and the materials deposited on it (as used herein, processing refers to etching, patterning, or preparing the materials disposed on the wafer at a particular point in the fabrication procedure).

Thin film transistors fabricated on test wafers in accordance with this invention have exhibited high mobilities. Specifically, TFTs were fabricated on test wafers to produce a structure similar to that illustrated in the Figure. A gate dielectric layer of silicon nitride having a thickness of about 1500 Å was deposited over the gate conductor in a plasma-enhanced chemical vapor deposition process. The surface of the gate dielectric layer was treated with a hydrogen plasma under conditions as specified in the notes to the table below. A layer of substantially hydrogenated amorphous silicon was deposited over the treated silicon nitride surface to a thickness of about 2000 Å. An n+ layer was deposited over the exposed amorphous silicon to a thickness of 500 Å. Source/drain metallization of 2000 Å of molybdenum was then deposited and patterned to form source and drain electrodes.

Comparison of effective mobility in TFTs fabricated without hydrogen plasma treatment with TFTs structurally similar but fabricated in accordance with this invention (with hydrogen plasma treatment of the silicon nitride gate dielectric layer at least 440 mW/cm$^2$ power density for at least 5 minutes) demonstrates that effective mobility was improved in devices fabricated in accordance with this invention. In these comparisons long channel (e.g., a channel length of about 40 μm) effective mobility is used. Long channel effective mobility measurements are used as the predominant determinant of the channel mobility in the device, and it is not appreciably affected by contact resistance to the source and drain electrodes. Effective mobility is determined from the slope of a plot of the drain current versus gate voltage at low drain voltage, e.g., 0.5 V and 8 V, respectively (that is, a low drain voltage relative to the gate voltage). Pertinent data include:

| Wafer | Hydrogen Plasma Treatment (see notes below for treatment times and power levels) | Long Channel Effective Mobility (cm$^2$/V-s) |
| --- | --- | --- |
| A (Control) | No | .67 |
| B | Yes* | no improvement noted |
| C | Yes** | .80 |
| D | Yes*** | .80 |

Wafer fabrication conditions:
A: Control (no hydrogen plasma treatment applied)
B: *300 sccm H$_2$, 22 mW/cm$^2$; 400 mTorr; 10 minutes;
C: **300 sccm H$_2$, 220 mW/cm$^2$, 400 mTorr, 30 minutes;
D: ***300 sccm H$_2$, 220 mW/cm$^2$, 1200 mTorr, 30 minutes.
All samples: V$_{drain}$ = 0.5 V; V$_{gate}$ = 8 V.

It is evident from the data that the method of fabricating TFTs using hydrogen plasma treatment in accordance with this invention produces devices having high effective mobilities.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method of fabricating a thin film transistor (TFT) comprising the steps of:
    forming a gate conductor on an upper surface of a substrate;
    depositing a gate dielectric layer over said gate conductor and said upper surface, said gate dielectric layer having an upper surface comprising silicon nitride having a stoichiometric ratio of nitrogen to silicon in the range of between about 1.2 to 1.45;
    treating the exposed upper surface of silicon nitride of said gate dielectric layer with a hydrogen plasma, said plasma being applied at least at a power density of 44 mW/cm$^2$ for 5 minutes;
    depositing a layer of amorphous silicon over the hydrogen-plasma treated gate dielectric layer, whereby the mobility of said amorphous silicon at the interface with said gate dielectric layer is enhanced;
    depositing a layer of n+ doped amorphous silicon over said amorphous silicon layer;
    depositing a layer of source/drain metallization over the n+ doped silicon layer; and
    patterning the source/drain metallization layer and underlying portions of said n+ doped layer to form respective source and drain electrodes.

2. The method of claim 1 wherein the step of treating the exposed surface of said gate dielectric layer with a hydrogen plasma further comprises the steps of:
    disposing the exposed silicon nitride surface in a reactor vessel; and
    applying the hydrogen plasma to the exposed surface at a selected pressure, for a selected exposure time at a selected plasma power density of at least 44 mW/cm$^2$ for a selected exposure time of at least 5 minutes.

3. The method of claim 2 wherein:
    said reactor vessel has an electrode to substrate separation of about 2.8 cm and an electrode cross-sectional area of about 4560 cm$^2$;
    said selected hydrogen plasma flow rate is in a range between about 30 sccm and 2000 sccm;
    the selected pressure of said hydrogen plasma is in a range between about 200 mTorr and 2000 mTorr;
    said selected exposure time is in a range between about 5 minutes and 60 minutes; and said selected plasma power density is in a range between about 44 mW/cm² and 440 mW/cm².

4. The method of claim 3 wherein the steps of depositing a gate dielectric layer and depositing a layer of amorphous silicon each comprise plasma enhanced chemical vapor deposition of said respective layers in said reactor vessel.

5. The method of claim 4 further comprising the steps of:

breaking vacuum in said reactor vessel after depositing said gate dielectric layer;

processing the materials disposed on said substrate;

placing the substrate and the processed material thereon in said reactor vessel; then establishing vacuum in said reactor vessel; and initiating the step of treating the exposed surface of said gate dielectric layer with said hydrogen plasma.

6. The method of claim 4 further comprising the step of:

depositing a passivation layer over said TFT after patterning said source drain metallization layer.

* * * * *